United States Patent
Jian et al.

(10) Patent No.: US 10,163,520 B1
(45) Date of Patent: Dec. 25, 2018

(54) OTP CELL WITH IMPROVED PROGRAMMABILITY

(71) Applicant: Synopsys, Inc., Mountain View, CA (US)

(72) Inventors: Chun Jian, San Jose, CA (US); Larry Wang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/785,364

(22) Filed: Oct. 16, 2017

(51) Int. Cl.
G11C 17/16 (2006.01)
G11C 17/18 (2006.01)
H01L 27/112 (2006.01)

(52) U.S. Cl.
CPC .............. *G11C 17/16* (2013.01); *G11C 17/18* (2013.01); *H01L 27/112* (2013.01); *H01L 27/11206* (2013.01)

(58) Field of Classification Search
CPC .. G11C 17/16; H01L 27/11206; H01L 27/112
USPC .................................... 365/96, 103
See application file for complete search history.

(56) References Cited

U.S. PATENT DOCUMENTS

| | | |
|---|---|---|
| 7,471,540 B2 | 12/2008 | Luan et al. |
| 7,623,368 B2 | 11/2009 | Luan |
| 8,513,770 B2 * | 8/2013 | Shin ............... H01L 23/5254 257/530 |
| 9,852,805 B2 | 12/2017 | Luan et al. |
| 2003/0071296 A1 | 4/2003 | Peng |
| 2003/0198085 A1 | 10/2003 | Peng |
| 2006/0221698 A1 | 10/2006 | Obuchi |
| 2007/0030719 A1 | 2/2007 | Hoefler et al. |
| 2012/0008364 A1 | 1/2012 | Lai et al. |
| 2016/0379720 A1 * | 12/2016 | Luan ............... G11C 17/18 365/96 |
| 2018/0047736 A1 * | 2/2018 | Seo ............... G11C 17/123 |

FOREIGN PATENT DOCUMENTS

KR 101095730 B1 12/2011

OTHER PUBLICATIONS

European Extended Search Report, European Application No. 17175419.5, dated Oct. 17, 2017, 7 pages.

* cited by examiner

*Primary Examiner* — Son Mai

(74) *Attorney, Agent, or Firm* — Fenwick & West LLP

(57) ABSTRACT

An integrated circuit OTP memory cell has a programming element with enhanced programmability. The programming element has a doped region at the surface of a semiconductor substrate and a conducting layer partially extending over a surface of the semiconductor surface and along a boundary of the doped region. The conducting layer is displaced from the surface of the doped region and the semiconductor substrate by a thin oxide layer. The partially extending conducting layer provides locations to concentrate electric fields and rupture the gate oxide layer during programming.

19 Claims, 6 Drawing Sheets

OTP CELL WITH IMPROVED PROGRAMMABILITY

BACKGROUND OF THE INVENTION

This invention relates to OTP (One-Time Programmable) memory cells and, in particular, to a memory cell structure with improved programmability.

An OTP memory cell stores a bit of information, a "1" or a "0," depending on whether the cell has been programmed or not. The particular correspondence between the value of a bit and whether the cell is programmed or not is arbitrarily defined. Programming is performed by the breakdown or rupture of the gate oxide of a programming element, a MOSFET (Metal-Oxide-Semiconductor Field Effect Transistor), in the memory cell. With the breakdown of the gate oxide of the MOSFET, a conducting plug is formed through the gate oxide to form a programmed connection between the gate electrode and a source/drain region of the MOSFET and/or the body underlying the source/drains of the MOSFET. Since a cell is programmed by creating an electrical connection, such memory cells are sometimes called "antifuse" OTP cells.

A problem with the programming of OTP memory cells is its variability. Gate oxide breakdown can vary widely with unwelcome decreased conductivity and large variations in the conductivity of the memory cells of an array of such cells. It is highly desirable that continued improvements in the programmed connections be achieved.

The present invention addresses one way that the programmability of OTP memory cells can be improved.

BRIEF SUMMARY OF THE INVENTION

The present invention provides for an integrated circuit OTP (One-Time Programmable) memory cell which has a MOSFET having a gate electrode, and first and second source/drain regions in a substrate for the integrated circuit, the first source/drain region connected to a first conducting line, and a gate electrode controlling electrical connection between the first and second source/drain regions, the gate electrode part of a second conducting line. The OTP cell also has programming element having a third conducting line parallel to the second conducting line and the third conducting line having an extending rectangular tab, the tab surrounded by the second source/drain region on three sides and displaced from a surface of the second source/drain region by a gate oxide layer. The rectangular enhances the programmability of the memory cell.

The present invention also provides for an integrated circuit OTP (One-Time Programmable) memory cell which has a MOSFET having a gate electrode and first and second source/drain regions in a substrate for the integrated circuit. The first source/drain region is connected to a first conducting line, and the gate electrode which controls electrical connection between the first and second source/drain regions is part of a second conducting line. The OTP memory cell also has a programming element having a third conducting line parallel to the second conducting line with at least one extension having three sides along a boundary of the second source/drain region, the extension displaced from a surface of the second source/drain region by a gate oxide layer to enhance the programming of the memory cell.

The present invention further provides for a programming element with enhanced programmability for an integrated circuit OTP (One-Time Programmable) memory cell. The programming element comprises a doped region at the surface of a semiconductor substrate and a conducting layer partially extending over a surface of the semiconductor surface and along a boundary of the doped region. The conducting layer is displaced from the surface of the doped region and the semiconductor substrate by a thin oxide layer. The partially extending conducting layer provides locations to concentrate electric fields and rupture the gate oxide layer by a programming voltage between the doped region and the conducting layer.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
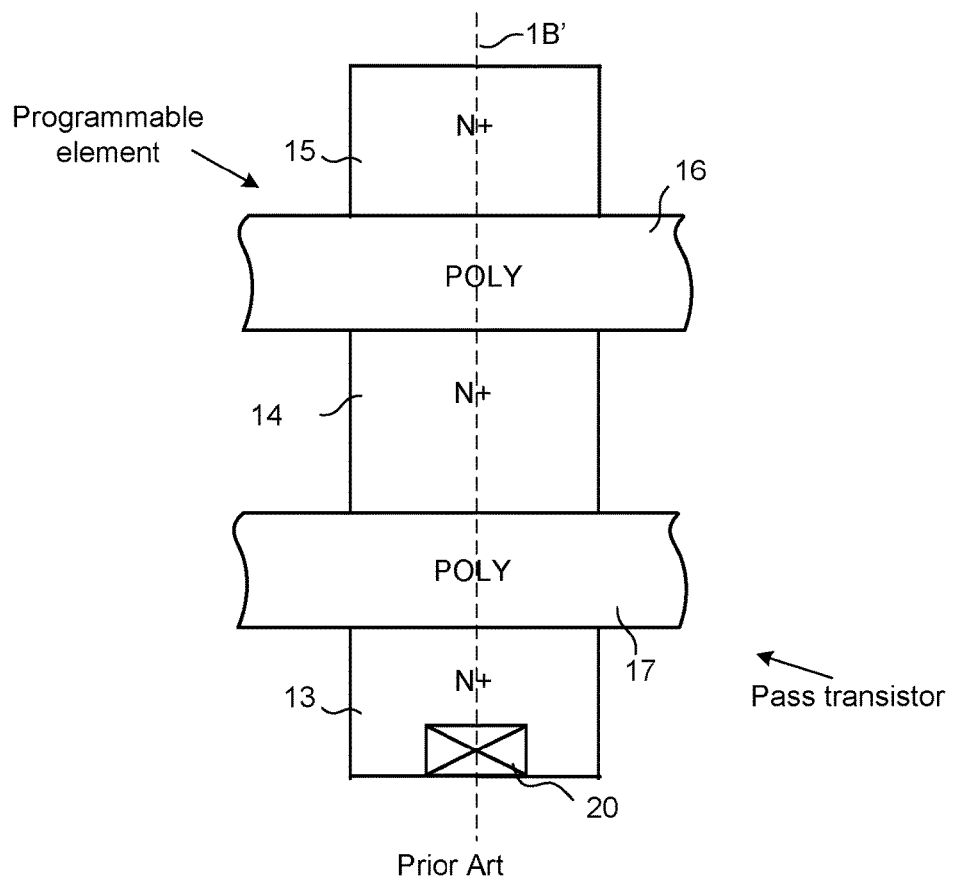
FIG. 1A shows a representational top view of an OTP memory cell of current manufacture.

FIG. 1A is a top view of a current two-transistor OTP memory cell. The memory cell has a pass or select transistor formed by a gate electrode 17 with two N+ source/drain regions 13 and 14 on either side of the electrode. The N+ source/drain region 13 is connected to a bit line BL (not shown in the drawing) above the OTP memory cell by a contact 20. Though not shown in the drawing, the bit line BL would run vertically in the drawing and cross over the contact 20. The N+ source/drain region 14 forms a source/drain region of a second MOSFET transistor, the programmable element, or program transistor. A second N+ source/drain region 15 which is electrically floating, is part of the second MOSFET transistor which has a gate electrode 16 slightly removed from and spanning the two N+ source/drain region 14 and 15.

It should be understood that the gate electrodes 16 and 17 are part of word lines which extend in one direction (perpendicular to the bit line BL) across a memory array of which the OTP memory cell is a part. The word lines become gate electrodes when they cross over a memory cell area with the source/drain regions 13, 14 and 15. The gate electrode 17 for the pass transistor is the read word line (WLr in FIG. 1B) of the memory array and the gate electrode 16 for the program transistor is the program word line (WLp in FIG. 1B). For ease of identification in the drawings, the gate electrodes are labeled, "Poly" and "Poly-gate," though the gate electrodes can be formed by many different conductive materials including, e.g., doped polysilicon, metals (such as tungsten and tantalum), silicides (alloys of metal and polysilicon), and other materials and combinations of materials, which are well known in the semiconductor processing field.

Figure 1B:
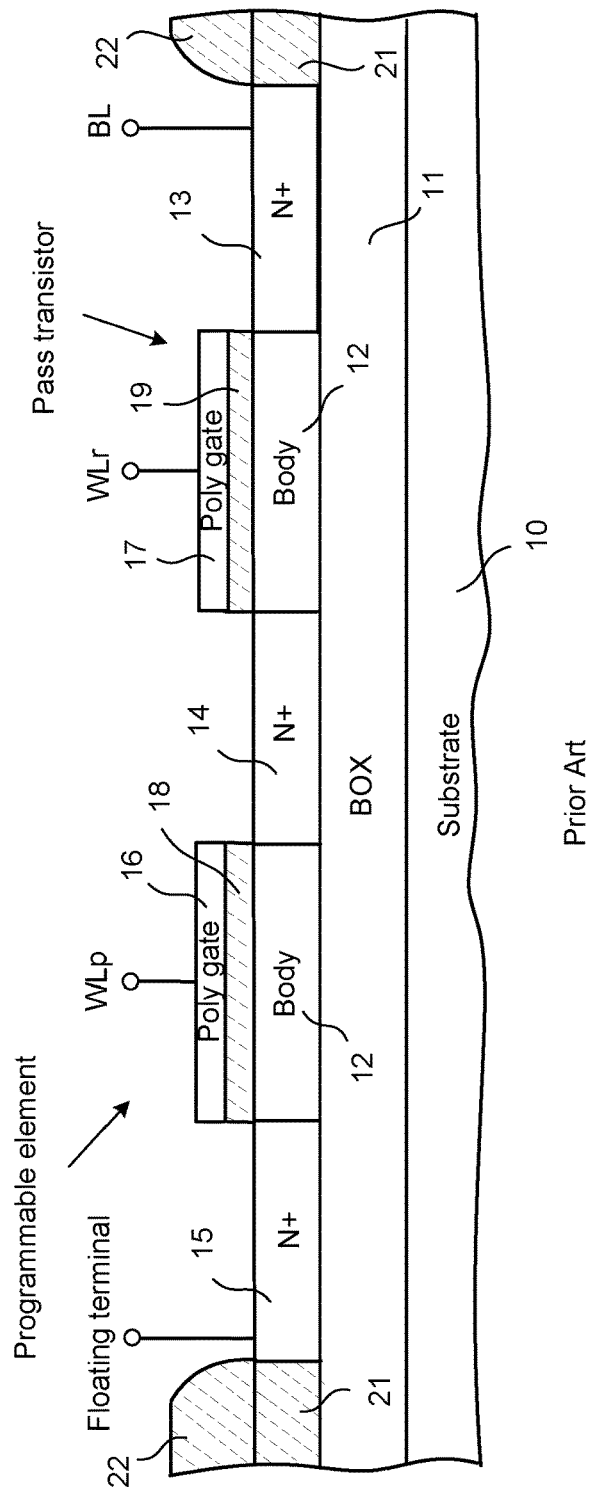
FIG. 1B shows a representational cross-sectional side view of the FIG. 1A memory cell.

Another view of the FIG. 1A OTP memory cell is shown in FIG. 1B. The cross-sectional side view of the cell is taken along dotted line 1B' in FIG. 1A. This somewhat stylized view shows a thin insulating oxide layer 19, a gate oxide, separates a P-type body 12 and N+ regions 13 and 14 from the gate electrode 17. The two source/drain regions 13 and 14 and the gate electrode 17 which spans the source/drain regions 13, 14 define a channel region on the top of the body 12 for the pass transistor. A thin insulating gate oxide layer 18 separates the body 12 and N+ regions 14 and 15 from the gate electrode 16. The two source/drain regions 14 and 15 and the gate electrode 16 which spans the source/drain regions 14, 15 define a channel region on the top of the body 12 for the programmable element. STI (Shallow Trench Isolation) region 21 with insulating oxide surrounds the memory cell and electrically isolates the memory cell. On top of the STI region 21 is a thick field oxide layer 22 over which the word lines/gate electrodes 16, 17 run. Though not shown in the top view of FIG. 1A, the STI region 21 and field oxide layer 22 surround the rectangular area formed by the N+ source/drain regions 13, 14 and 15, and the areas underlying the gate electrodes 16 and 17.

The particular MOSFET technology shown in this example of a two-transistor OTP memory cell is a SOI (Silicon-On-Insulator) process. The P-type body 12 rests on an insulating BOX (Buried OXide) layer 11 which in turn rests on a semiconductor substrate 10. Other semiconductor structures and processes can be used to construct two-transistor OTP memory cells, such as described in U.S. Pat. Nos. 7,471,540 and 7,623,368, both of which are assigned to the present assignee and incorporated by reference herein for all purposes.

The source/drain region 13 is connected to the bit line BL (not shown) which runs vertically in FIG. 1A and horizontally in FIG. 1B above the memory cell. The source/drain region 15 is left floating. Programming is performed by a high voltage on the gate electrode 16 (word line WLp), a voltage on gate electrode 17 (word line WLr) to turn on the pass transistor and a voltage on the source/drain region 13 (bit line BL) to create a large voltage between the source/drain region 14 and body 12 across the gate oxide 18. This voltage breaks down or ruptures the gate oxide 18 of the programming element, the second transistor. With the breakdown of the gate oxide 18, a conducting plug is formed through the gate oxide 18 to form a programmed connection between the gate electrode 16 and the N+ source/drain region 14 and/or the underlying body 12. However, there are still variations in the programming process and in the resulting electrical parameters of the programmed connections. More consistency and precision is desirable.

Figure 2A:
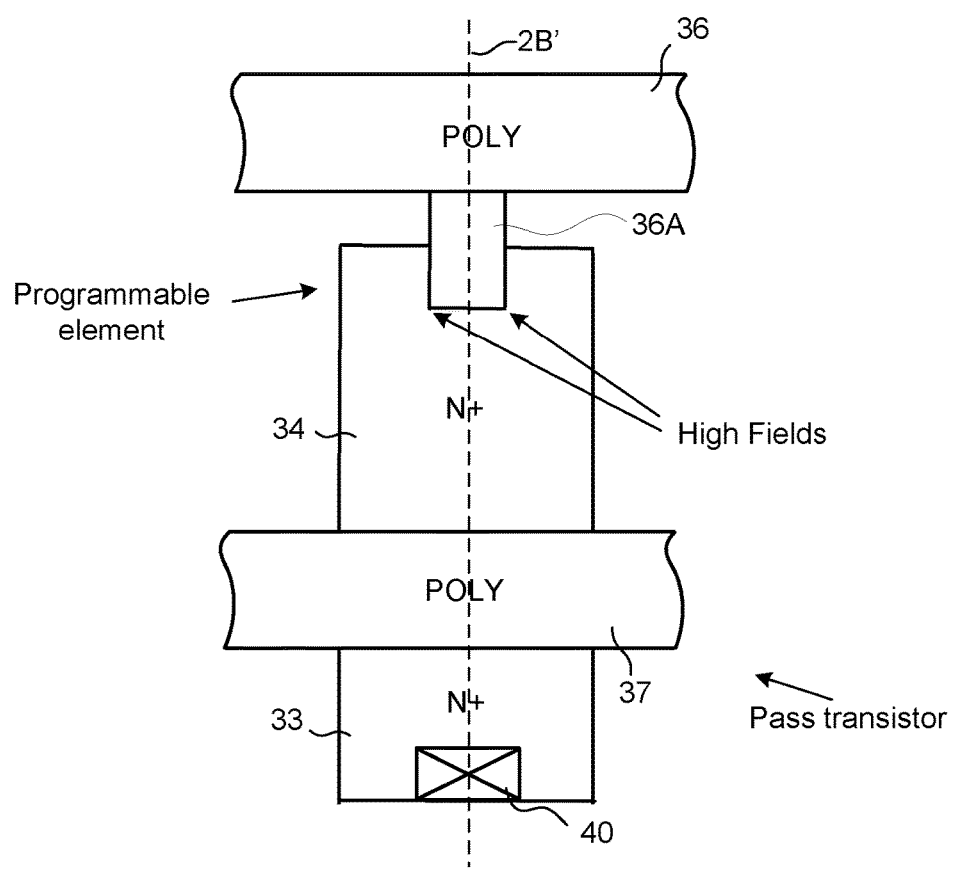
FIG. 2A shows a representational top view of an OTP memory cell according to one embodiment of the present invention.
Figure 2B:
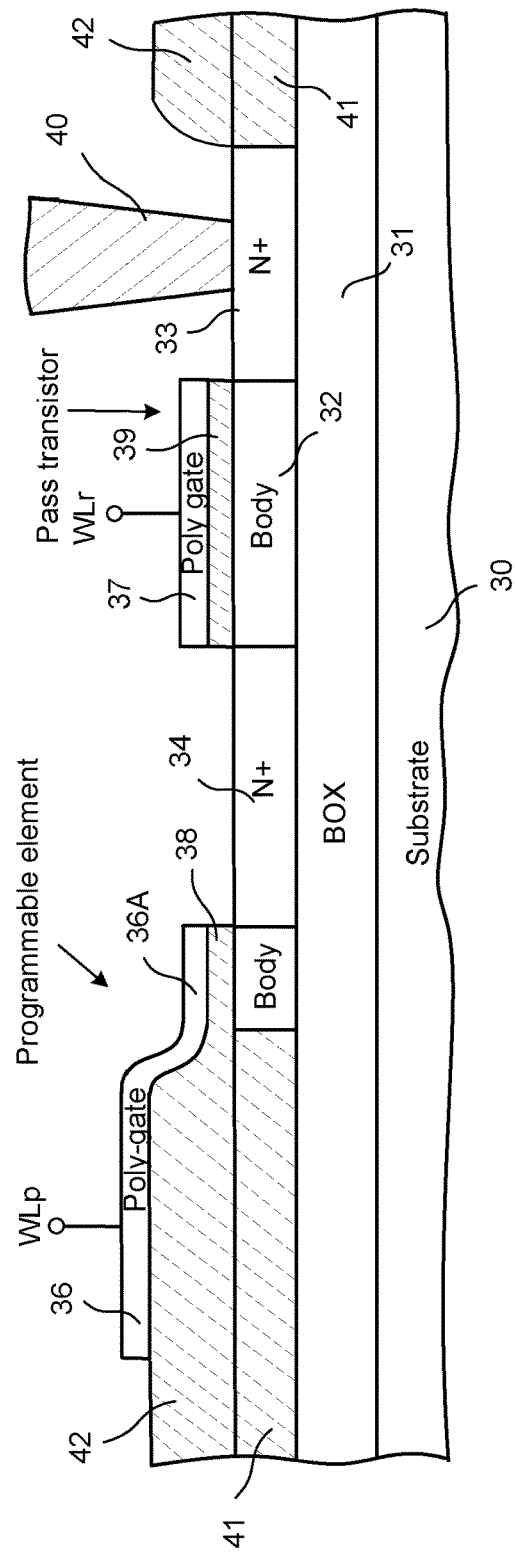
FIG. 2B shows a cross-sectional side view of the FIG. 2A memory cell for one semiconductor manufacturing process.

In the present invention, a different arrangement of an OTP memory cell is presented. The periphery of the memory cell re-defined by adjusting the edge of the N+ source/drain regions and the programmable element is changed from a second MOSFET to a simple rectangular tab over a source/drain region of the pass transistor. FIG. 2A is a top view and FIG. 2B a cross-sectional view of an OTP memory cell which has many elements similar to that of the FIG. 1A memory cell. The differences according to one embodiment of the present invention are described.

The pass transistor has a gate electrode 37 slightly removed from and spanning two N+ source/drain regions 33 and 34, a similar arrangement to that of FIG. 1A. The N+ source/drain region 33 is connected to a bit line BL (not shown in the drawing) above the OTP memory cell by a contact 40. Though not shown in the drawing, the bit line BL would run vertically in the drawing over the contact 40. The N+ source/drain region 34 of the pass transistor is extended away from the gate electrode 37, part of the read word line WLr running horizontally in the drawing. Compared to the FIG. 1A, B memory cell, the conducting layer 36 for the programming element is displaced away from the gate electrode 37 so that it lies over the thick field oxide layer 42. From the conducting layer 36, part of the programming word line WLp running parallel to the read word line WLr, a rectangular tab 36A extends down to lie over next to a portion of the N+ source/drain region 34 and on a thin insulating oxide layer 38 shown in the FIG. 2B cross-sectional side view of the OTP memory cell of FIG. 2A. The conducting layer 36 and extending tab 36A are formed from the same poly-gate material as the gate electrode 37. In the manufacturing process the tab 36A and gate electrode 37 are part of the mask for the formation of the source/drain 34 (and 33).

The thin oxide layer 38 can be formed in the same process step used to form the gate oxide layer 39 of the pass transistor. The resulting thicknesses of the two layers 38 and 39 should be equal. Alternatively, the two layers 38 and 39 can be formed with different thicknesses. The thickness for the oxide layer 38 is determined by the particular processing technology used to manufacture OTP memory cell and it is preferable to use thinner gate oxides. For 55 nm CMOS process technology, the oxide layer 38 is about 20Å (Angstroms). The thin oxide layer 38 acts similarly to the gate oxide 18 of the FIG. 1A OTP memory cell in a programming operation. That is, to program the FIG. 2A, B OTP memory cell, a large voltage is created between the tab 36A and the N+ region 34 to rupture the thin oxide layer 38. The programming operation with the word lines WLp and WLr, and bit line BL is similar to that of the FIG. 1A, B memory cell.

Figure 2C:
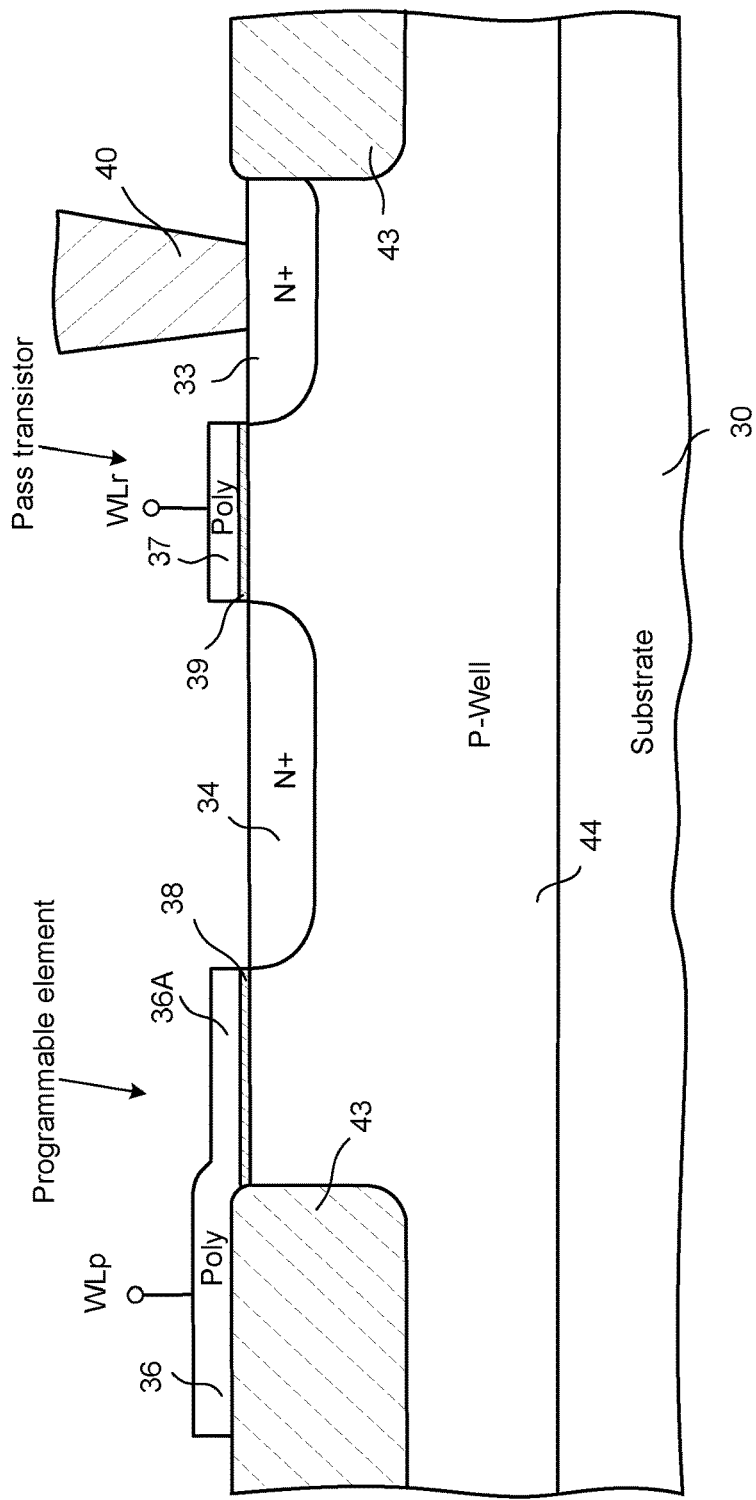
FIG. 2C shows a cross-section side view of the FIG. 2A memory cell for another semiconductor manufacturing process.

FIG. 2C is a cross-sectional side view of the FIG. 1A OTP memory cell manufactured with a different semiconductor process. Here the memory cell is located in a P-well 44 and isolated by STI (Shallow Trench Isolation) layers 43. The drawing is more natural and less stylized than the FIG. 2B drawing.

There are many benefits to the described OTP memory cell with the tab 36A. The bottom and sides of the extending tab 36A form three edges (on the sides and end of the tab) to concentrate the electric fields during programming. Furthermore, the corners on the tab 36A concentrate the electric fields even more. The corners, as indicated by the notation "High Fields," in the FIG. 2A top view, and edges rely on the well-known physical principle that charged bodies with small radii concentrate electric fields. The smaller the radii the more the fields are concentrated. The best example of this is the lightning rod. Given the vagaries of semiconductor processing, it is desirable that a programming element provide as many locations for a weakness in the gate oxide to occur and enhance the programmability of the memory cell, as provided by the programming element of FIGS. 2A-C.

Furthermore, from the reduction in the size of the tab 36A and the gate oxide area below the tab as compared to that of the gate electrode 18 and the gate oxide area below the gate electrode, the breakdown current density is also increased. Breakdown in the program transistor of FIGS. 1A, B frequently occurs inside the channel region of the transistor. Since the tab 36A is not a transistor, the breakdown occurs at the edges of the tab 36A resulting in a better read current.

Additionally, the intersection of the overlying tab 36A and the edges is far removed from the pass transistor gate electrode 37 and N+ source/drain region 33. This reduces the chances of undesirable breakdowns often occur along the STI interface which are often defective. In contrast, the intersection of the overlying gate electrode 16 and the edges of the STI region 21 of the program transistor in FIG. 1A, B is undesirably much closer to the pass transistor.

Finally, the size of the tab 36A is decoupled from the width of the programming word line WLp so the size of the tab 36A can be designed for optimal programming results without impacting the width of the word line, which inversely defines the series resistance of the word line. This is not the case for the current OTP memory cell since the width of the word line WLp/gate electrode 16 defines the channel region, the active area for programming.

Figure 3:
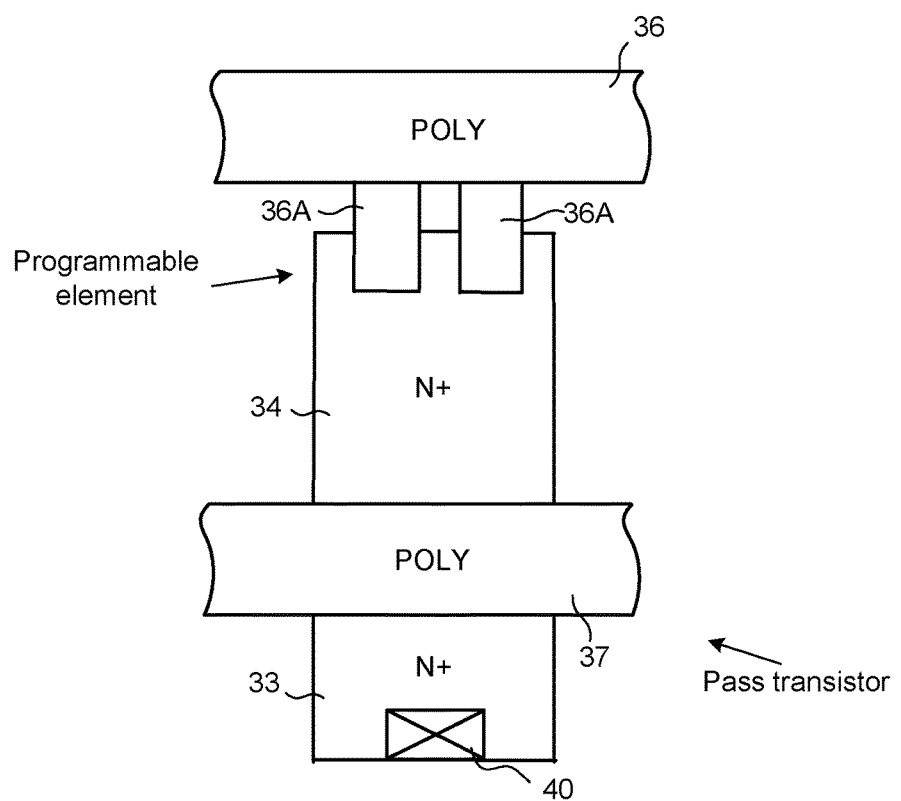
FIG. 3 shows a representational top view of a variation of the FIG. 2A OTP memory cell according to an embodiment of the present invention.

The same semiconductor processes used for current two-transistor OTP memory cells can easily be adapted for manufacturing the OTP memory cell of the present invention. Changes to the locations of, and the extensions to, the gate electrode 36 and the N+ doping areas for the source/drain regions require simple changes to photolithographic masks. Another simple change creates two extending tabs 36A as illustrated in FIG. 3. The number of edges and corners is doubled for further programmability according to this embodiment of the present invention.

Hence the described OTP memory cell with one or more extending tabs provides for consistent and precise programming. Variability of the electrical parameters of the programmed OTP memory cell is reduced and the OTP memory cell is easily adaptable from current semiconductor processes.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. An integrated circuit OTP (One-Time Programmable) memory cell comprising:
a transistor having a gate electrode, and first and second source/drain regions in a substrate for the integrated circuit located at opposite sides of the gate electrode, the first source/drain region connected to a first conducting line, and the gate electrode controlling electrical connection between the first and second source/drain regions, the gate electrode part of a second conducting line; and
a programming element comprising:
a conducting layer displaced away from the gate electrode of the transistor and connected to a third conducting line parallel to the second conducting line, and
a rectangular tab extending from the conducting layer next to a portion of the second source/drain region and separated from a surface of the second source/drain region by a gate oxide layer, wherein at least one edge of the rectangular tab is at a distance from the first source/drain region of the transistor preventing breakdowns along an interface between an isolation layer of the transistor and the first source/drain region of the transistor.

2. The OTP memory cell of claim 1, wherein the first conducting line comprises a bit line, the second conducting line comprises a word line for accessing the memory cell, and the third conducting line comprises another word line for programming the memory cell.

3. The OTP memory cell of claim 1, wherein the first and second source/drain regions comprise N+ semiconductor regions.

4. The OTP memory cell of claim 1, wherein each of the second and third conducting lines comprises a poly-gate material.

5. The OTP memory cell of claim 4, wherein the rectangular tab comprises the poly-gate material.

6. The OTP memory cell of claim 1, further comprising another rectangular tab extending from the conducting layer next to another portion of the second source/drain region and separated from the surface of the second source/drain region by the gate oxide layer.

7. The OTP memory cell of claim 6, wherein the other rectangular tab extends parallel to the rectangular tab.

8. An integrated circuit OTP (One-Time Programmable) memory cell comprising:
a transistor having a gate electrode, and first and second source/drain regions in a substrate for the integrated circuit located at opposite sides of the gate electrode, the first source/drain region connected to a first conducting line, and the gate electrode controlling electrical connection between the first and second source/drain regions, the gate electrode part of a second conducting line; and
a programming element having a third conducting line parallel to the second conducting line with at least one extension having three sides along a boundary of the second source/drain region, the at least one extension separated from a surface of the second source/drain region by a gate oxide layer, and at least one edge of the at least one extension is at a distance from the first source/drain region of the transistor preventing breakdowns along an interface between an isolation layer of the transistor and the first source/drain region of the transistor.

9. The OTP memory cell of claim 8, wherein the first conducting line comprises a bit line, the second conducting line comprises a word line for accessing the memory cell, and the third conducting line comprises another word line for programming the memory cell.

10. The OTP memory cell of claim 8, wherein the first and second source/drain regions comprise N+ semiconductor regions.

11. The OTP memory cell of claim 8, wherein each of the second and third conducting lines comprises a poly-gate material.

12. The OTP memory cell of claim 11, wherein the at least one extension comprises the poly-gate material.

13. The OTP memory cell of claim 8, wherein the programming element further comprises a second extension from the third conducting line, the second extension having three sides along the boundary of the second source/drain region, the second extension separated from the surface of the second source/drain region by the gate oxide layer.

14. The OTP memory cell of claim 13, wherein the second extension extends parallel to a first extension of the at least one extension.

15. A programming element for an integrated circuit OTP (One-Time Programmable) memory cell, the programming element comprising:
a doped region in a semiconductor substrate;

a conducting layer partially extending over the semiconductor substrate and separated from a surface of the semiconductor substrate by a first oxide layer; and at least one rectangular tab extending from the conducting layer next to a portion of the doped region and separated from a surface of the doped region by a second oxide layer, wherein at least one edge of the at least one rectangular tab is at a distance from another doped region in the semiconductor substrate preventing breakdowns along an interface between an isolation layer in the semiconductor substrate and the other doped region, the doped region and the other doped region located at opposite sides of a gate electrode of a pass transistor for the memory cell.

16. The programming element of claim 15, wherein the doped region comprises a source/drain region of the pass transistor for the memory cell.

17. The programming element of claim 16, wherein the doped region comprises an N+ region in the semiconductor substrate.

18. The programming element of claim 15, wherein the at least one rectangular tab comprises at least three sides along a boundary of the doped region.

19. The programming element of claim 15, wherein the at least one rectangular tab comprises six sides along a boundary of the doped region.

* * * * *

UNITED STATES PATENT AND TRADEMARK OFFICE
CERTIFICATE OF CORRECTION

| | | |
|---|---|---|
| PATENT NO. | : 10,163,520 B1 | Page 1 of 1 |
| APPLICATION NO. | : 15/785364 | |
| DATED | : December 25, 2018 | |
| INVENTOR(S) | : Chun Jiang and Larry Wang | |

It is certified that error appears in the above-identified patent and that said Letters Patent is hereby corrected as shown below:

On the Title Page

Inventors item (72) delete "Chun Jian" and insert --Chun Jiang--

Signed and Sealed this
Twenty-fifth Day of June, 2019

Andrei Iancu
*Director of the United States Patent and Trademark Office*